June 2, 1970 TADASHI YAMADA ET AL 3,516,034

ELECTROMAGNETIC RELAY UTILIZING A SEMICONDUCTOR ELEMENT

Filed July 31, 1968

INVENTORS
TADASHI YAMADA,
AKIO YAMASHITA, MASARU TANAKA,
TAKEHIRO TSUZAKI, TAKASHI FUJITA
BY Stevens, Davis, Miller & Mosher
ATTORNEYS United States Patent Office 3,516,034

Patented June 2, 1970

3,516,034

ELECTROMAGNETIC RELAY UTILIZING A SEMICONDUCTOR ELEMENT

Tadashi Yamada, Suita-shi, Akio Yamashita, Ikeda-shi, Masaru Tanaka, Toyonaka-shi, Takehiro Tsuzaki, Osaka, and Takashi Fujita, Toyonaka-shi, Japan, assignors to Matsushita Electric Industrial Co., Ltd., Osaka, Japan, a corporation of Japan Filed July 31, 1968, Ser. No. 749,021
Int. Cl. H01h
U.S. Cl. 335—2 3 Claims

ABSTRACT OF THE DISCLOSURE

An electromagnetic relay utilizing a semiconductor element which is switched between a conductive state and a non-conductive state without any physical motion, according to the signal current flowing through the electromagnetic coil of the relay.

This invention relates to a contactless electromagnetic relay utilizing a semiconductor element which is switched between a conductive state and a non-conductive state through an electromagnetic arrangement.

That is, a solid state semiconductive switching element which is non-conductive when no pressure is imposed thereon but conductive when a pressure is imposed, is used in this invention. This element is placed between two soft magnetic bodies (or attached on one end face of a soft magnetic body) coupled with a magnetizing coil and is switched between a conductive state and a non-conductive state depending on excitation of the magnetizing coil without any substantial movement of the magnetic bodies.

A conventional electromagnetic relay operated by energizing the exciting coil with a signal current, is provided with one or more pairs of contacts which make or break mechanically according to the excitation of the coil, whether the contacts are exposed to the air or sealed in a vacuum enclosure as in reed relays.

As to the element for converting a mechanical signal applied thereto in the form of pressure to an electric signal, various types of transducers have been proposed hitherto.

For example, a semiconductor element which has a P-N junction near its surface is known to increase the forward or backward current when a pressure is imposed thereon. It is also known that the negative resistivity due to the tunnel effect can be varied by applying a pressure to a P-N junction which has the tunnel effect. The reasons for these phenomena are presumed to be that the pressure affects the center of generation and recombination of the electrons and holes in the junction or varies the width of the inhibiting zone.

Another attempt for converting a mechanical signal to an electric signal is the use of a thin film of Ge as a strain gauge. This will be attributed to the piezo-resistive effect.

In this invention, a solid-state switching element of a higher sensitivity to pressure than those of the conventional elements mentioned above, is used.

This switching element comprises a solid body having an inhibiting zone such as a semiconductor or a dielectric material doped with an impurity which forms a deep level in the solid body, and the element can vary its resistivity or the negative resistivity of current controlling type in a high sensitivity.

Figure 1:
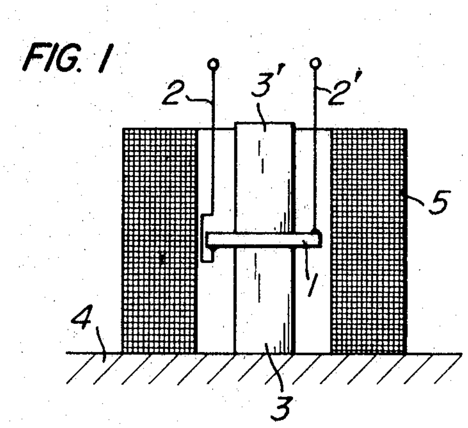
Figure 2:
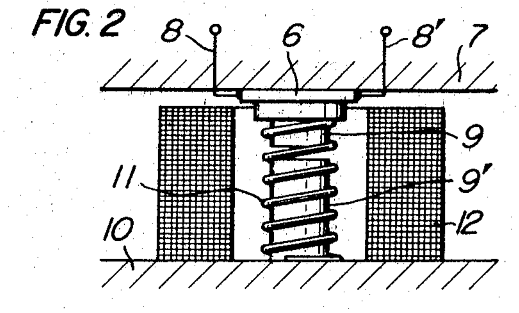
Figure 3:
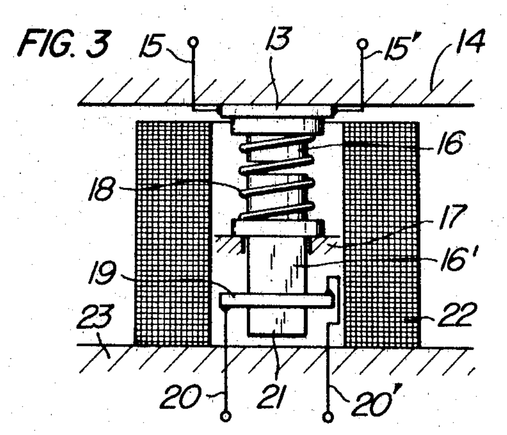

Hereunder, this invention will be explained in detail in connection with embodiments of this invention, referring to the attached drawings, in which:

FIGS. 1, 2 and 3 are sectional front views respectively of different embodiments of this invention.

Now, referring to FIG. 1 which schematically shows the structure of an embodiment of this invention, reference numeral 1 indicates a solid-state switching element which comprises a solid body having an inhibiting zone including a semiconductor such as Ge, Si, GaAs, CdS or Se or a dielectric material such as $BaTiO_3$, $TiO_2$ or SiO, said solid body being doped with an impurity such as Au, Cu, Fe or Co which forms a deep level in the solid body and being incased in metallic material or synthetic resin; numerals 2 and 2′ indicate leads electrically connected to said switching element 1 at the opposite end portions of said element; numeral 3 a stationary prism of soft magnetic material such as iron or ferrite, whose top face is in close contact with the bottom of said switching element 1 so that a pressure can be conveyed from the former to the latter and whose bottom is secured to the base 4; numeral 3′ also a prism of soft magnetic material such as iron or ferrite, whose bottom is in close contact with the top face of the switching element 1 and whose top is free; and numeral 5 a cylindrical electromagnetic coil disposed around said magnetic prisms 3 and 3′, which is energized with the signal current having energy and information by which the soft magnetic prisms 3 and 3′ can arbitrarily be actuated.

The operation of this device is as follows: An input signal energizes the coil 5 to establish a magnetic field which magnetizes the prisms 3 and 3′. Thence the magnetized prisms 3 and 3′ pull each other to press the switching element 1 between them, thereby noticeably reducing the resistivity of said element. Thus, the switching element 1 is turned conductive.

Contrarily, when the current is cut off through the coil 5, the pulling force between the magnetic prisms 3 and 3′ is extinguished, thereby noticeably increasing the resistivity of the switching element 1 to a non-conductive state. It will be noted that in the above-described constitution, the sensitivity of an electromagnetic means can be raised further by the use of a magnetic body which forms a closed magnetic circuit, instead of the straight prisms 3 and 3′.

Referring to FIG. 2 which schematically shows the structure of another embodiment of the relay according to this invention, reference numeral 6 indicates a solid-state switching element of a similar constitution as the element 1 shows in FIG. 1, whose top face is in close contact with a fixed frame 7; numerals 8 and 8′ leads connected to said switching element 6; numeral 9 a soft magnetic body whose top face is in close contact with the bottom of the element 6; numeral 9′ another soft magnetic body whose top face is opposed to the bottom of the above-mentioned magnetic body 9 leaving a space of at most a few millimeters and whose bottom is secured to the base 10; numeral 11 a spring mounted between the magnetic body 9 and the base 10 so as to give a pressure to the switching element 6; and numeral 12 indicates an electromagnetic coil similar to the coil 5 in FIG. 1.

The electromagnetic relay of this embodiment operates as follows: When there is no signal current through the coil 12, the switching element 6 is under the pressure of the spring 11 and therefore in a conductive state. If a signal current flows through the coil 12, the magnetic field caused by the current creates a pulling force between the two magnetic bodies 9 and 9′, which tends to cancel the force of the spring 11 and accordingly to reduce the pressure imposed on the switching element 6. Thus, the resistivity of the element 6 is raised to a non-conductive state. That is; in this embodiment, the electromagnetic relay of his invention is non-conductive when there is a signal current but conductive when there is no signal current through the coil.

FIG. 3 is a schematic drawing which shows the structure of still another embodiment of this invention. A relay of this embodiment is a combination of the relay shown in FIG. 1 and the one in FIG. 2, which assumes at the same time both conductive and non-conductive states.

In FIG. 3, numerals 13, 14, 15, 15' and 16 indicate respectively a solid-state switching element, a fixed frame, two leads and a soft magnetic body, respectively corresponding to the switching element 6, the fixed frame 7, two leads 8 and 8', and the soft magnetic body 9 shown in FIG. 2. Numeral 16' indicates another soft magnetic body secured to the support 17 in its mid-portion, whose top face is opposed to the bottom of the magnetic body 16 leaving a space of at most a few millimeters; numeral 18 a spring inserted between the magnetic body 16 and the mid-portion of the magnetic body 16' so as to impose a pressure on the switching element 13; numeral 19 a second solid-state switching element whose top face is in close contact with the bottom of the magnetic body 16'; numerals 20 and 20' two leads connected to the switching element 19; numeral 21 another soft magnetic body attached to the bottom of the switching element 19 with its top face; numeral 22 an electromagnetic coil; and numeral 23 indicates a base for supporting said coil 22.

The operation of this relay is as follows: When there is no signal current through the coil 22, the element 19 is in a non-conductive state, while the element 13 is conductive as it is under the pressure of the spring 18. However, if a signal current flows through the coil 22 to create a magnetic field, a pulling force occurs between two magnetic bodies 16 and 16', which tends to cancel the force of the spring 18. Accordingly, the resistivity of the element 13 increased up to a non-conductive state while the element 19 becomes conductive owing to the pulling force between the magnetic bodies 16' and 21. Thus, the electromagnetic relay in this embodiment of the invention includes two functions which operate oppositely in response to a signal current.

As described above, according to this invention utilizing the switching element which comprises a solid body having an inhibiting zone such as a semiconductor or a dielectric material doped with an impurity to form a deep level in the solid body and which varies its resistivity or the negative resistivity according to the pressure applied thereto, a static and contactless relay of a desired switching type is obtained by placing said switching element between two soft magnetic bodies or on one end face of a magnetic body according to respective switch requirements. As the relay of this invention has substantially no moving part, it assures a quick operation and is free from troubles such as chattering contacts and wear of contacts which are very common problems in a conventional electromagnetic relay and reed relay. Accordingly, the relays of this invention will be widely used as highly reliable relays in digital computers or in other fields of technique.

Further, if one of the magnetic bodies is substituted by a ferromagnetic body such as barium-ferrite, a polarized relay will be obtained.

What is claimed is:

1. A contactless electromagnetic relay comprising a pressure-sensitive solid-state switching element including a solid body having an inhibiting zone, said body having a bulk selected from the group consisting of germanium, silicon, cadmium sulfide, gallium arsenide, selene, barium metatitanate, titanium dioxide and silicon oxide, said bulk being doped with an impurity selected from the group consisting of gold, copper, iron and cobalt which forms a deep energy level in the bulk whereby the resistivity of the solid body remarkably varies in accordance to a pressure applied thereto, and electromagnetic means for imparting a force within predetermined values to said solid body.

2. A contactless electromagnetic relay according to claim 1 further comprising a first prism of soft magnetic material in contact with a surface of said element and a second prism of soft magnetic material in contact with the opposite surface of said element, an electromagnetic coil disposed around both of the magnetic prisms, and means to energize said coil whereby a magnetic field is established to magnetize said prisms and apply force to said element.

3. A contactless electromagnetic relay according to claim 1 wherein the top surface of the element is in contact with a fixed frame member and further comprising a first soft magnetic body in contact with the bottom surface of said element, a second soft magnetic body secured to a base member and spaced from said first body, a spring mounted between the first soft magnetic body and said base member, an electromagnetic coil surrounding said element and both said soft magnetic bodies, and means to energize said coil whereby a magnetic field is established to magnetize said prisms and apply force to said element.

References Cited

UNITED STATES PATENTS

| | | | |
|---|---|---|---|
| 2,632,062 | 3/1953 | Montgomery | 338—114 |
| 2,867,043 | 1/1959 | Jarret | 338—114 |
| 2,951,817 | 9/1960 | Myers | 338—114 |
| 3,386,067 | 5/1968 | Costanzo | 338—114 |

BERNARD H. GILHEANY, Primary Examiner

H. BROOME, Assistant Examiner

U.S. Cl. X.R.

338—114